(12) United States Patent
Tang et al.

(10) Patent No.: US 6,643,199 B1
(45) Date of Patent: Nov. 4, 2003

(54) MEMORY WITH REDUCED SUB-THRESHOLD LEAKAGE CURRENT IN DYNAMIC BIT LINES OF READ PORTS

(75) Inventors: Stephen H. Tang, Beaverton, OR (US); Steven K. Hsu, Lake Oswego, OR (US); Vivek K. De, Beaverton, OR (US); Shih-Lien L. Lu, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/162,929

(22) Filed: Jun. 4, 2002

(51) Int. Cl.[7] .................................................. G11C 7/00
(52) U.S. Cl. .............. 365/204; 365/189.11; 365/189.05
(58) Field of Search ........................... 365/204, 189.11, 365/189.05

(56) References Cited

U.S. PATENT DOCUMENTS 5,297,104 A * 3/1994 Nakashima ................. 365/204
5,751,643 A * 5/1998 Lines ..................... 365/189.11

OTHER PUBLICATIONS

"A 0.13 um 6GHz 256 x32b Leakage–tolerant Register File", Ram Krishnamurthy, et al., pp. 25–26, Mar. 2001.

* cited by examiner

Primary Examiner—Huang Hoang
(74) Attorney, Agent, or Firm—Seth Z. Kalson

(57) ABSTRACT

For a memory cell, where an access transistor couples the memory cell to a local bit line, a pMOSFET essentially eliminates sub-threshold leakage current in the access transistor when the memory cell is not being read, and when the memory cell is being read, an additional pMOSFET essentially eliminates sub-threshold leakage current in the access transistor if the memory cell stores an information bit such that it does not discharge the local bit line. In this way, a half-keeper connected to the local bit line does not need to contend with sub-threshold leakage current.

18 Claims, 5 Drawing Sheets

MEMORY WITH REDUCED SUB-THRESHOLD LEAKAGE CURRENT IN DYNAMIC BIT LINES OF READ PORTS

FIELD

Embodiments of the present invention relate to digital circuits, and more particularly, to high speed memory circuits.

BACKGROUND

Caches and register files are high speed memory used to store instructions and operands for instructions. They are critical components of microprocessors because of requirements for high speed and reliability. A portion of a computer system with high speed memory is abstracted at a high level in FIG. 1. Microprocessor 102 comprises cache 104 and register files 106. Cache 104 may be part of a memory hierarchy to store instructions and data, where system memory 108 is part of the memory hierarchy. Communication between microprocessor 102 with memory 108 is facilitated by memory controller (or chipset) 110, which also facilitates in communicating with peripheral components 112. Microprocessor communicates directly with memory controller 110 via bus or point-to-point interconnect 114.

Because of the performance requirements placed upon caches and register files, high-performance domino type logic is often used. LOW-$V_T$ (low threshold voltage) transistors have been used in domino logic to improve speed, but the use of such devices may lead to an increase in sub-threshold leakage current. Sub-threshold leakage current may impact the performance of high speed memory if it is not reduced or taken into account.

Consider a typical implementation of a register file as illustrated in FIG. 2. For simplicity, FIG. 2 does not show any write ports, and shows only one read port (one local bit line). The bit line portion of a memory read port may be viewed as essentially a wide OR domino gate. In the particular example of FIG. 2, there are sixteen memory cells sharing local bit line 202, but for simplicity only memory cells 204 and 206 are shown, where word line 208 is used to access memory cell 204 during a read operation, and word line 210 is used to access memory cell 206 during a read operation. The clock signal is denoted by φ. The clock signal φ is LOW ($V_{SS}$) during a pre-charge phase, so that pMOSFET 212 is switched ON to pre-charge local bit line 202 HIGH ($V_{CC}$). During an evaluation phase (read operation), the clock signal φ is HIGH so that pMOSFET 212 is OFF, and a half keeper comprising pMOSFET 214 and inverter 216 continues to keep local bit line 202 charged unless it is otherwise discharged by one or more of the memory cells sharing local bit line 202.

Ideally, local bit line 202 would only be discharged during a read operation if the information bit stored in the memory cell being read is such as to switch ON its associated access transistor. For example, if the state (stored information bit) of memory cell 204 is such that the gate voltage on access nMOSFET 218 is HIGH, then when word line 208 is HIGH during a read operation, memory cell 204 will discharge local bit line 202. If, on the other hand, the information bit stored in memory cell 204 is such that the gate of access nMOSFET 218 is LOW, then local bit line 202 should maintain its charged state so that the stored information bit is correctly read. However, in a worst-case scenario, all other memory cells not being read may be such that the gate voltages on their respective access nMOSFETs are all HIGH, and consequently the accumulative effect of sub-threshold leakage current through their respective access nMOSFETs may be sufficiently large to discharge local bit line 202 to a voltage in which an incorrect read result is performed. The half-keeper comprising pMOSFET 214 may be sized larger to contend with the sub-threshold leakage, but this leads to an increase energy dissipation as well as a decrease in performance.

Many techniques have been suggested and taught for mitigating the effects of sub-threshold leakage current in high speed memory, as discussed above. For example, the circuit of FIG. 3 is taught in "A 0.13 um 6 GHz 256×32b Leakage-Tolerant Register File," by R. Krishnamurthy et al., 2001 Symposium on VLSI Circuits Digest of Technical Papers, pp. 25–26, 2001. For simplicity, FIG. 3 shows only two memory cells connected to local bit line 302, but in practice there may be many such memory cells. Referring to memory cell 304, when a read operation is performed on this memory cell, word line 306 is held HIGH so that the source of access transistor 308 is brought to $V_{SS}$, and the operation is similar to that of FIG. 2. However, when no read operation is being performed on memory cell 304, word line 306 is LOW, in which case pullup pMOSFET 310 charges the source of access transistor 308 to $V_{CC}$. In this case, if local bit line 302 is HIGH, then both the source and drain of access transistor 308 are HIGH but its gate is at $V_{SS}$, so that $V_{DS}$ is zero and $V_{GS}$ is $-V_{CC}$, and consequently sub-threshold leakage current is essentially eliminated. (If local bit line 302 were LOW, then it was brought LOW by a memory cell being read, in which case sub-threshold leakage current is not an issue.)

However, if memory cell 304 is being read, and the stored information bit is such that the gate voltage of access transistor 308 is at $V_{SS}$, then the gate-to-source voltage $V_{GS}$=0 and the source-to-drain voltage $V_{DS}$=$V_{CC}$, and the resulting sub-threshold leakage current conducted by access transistor 308 should be supplied by the half-keeper to prevent false evaluation. Consequently, although unwanted sub-threshold leakage current for memory based upon the circuit of FIG. 3 is essentially eliminated when a word line is held LOW, there nevertheless may be unwanted sub-threshold leakage current during a read operation.

DESCRIPTION OF EMBODIMENTS

Figure 1:
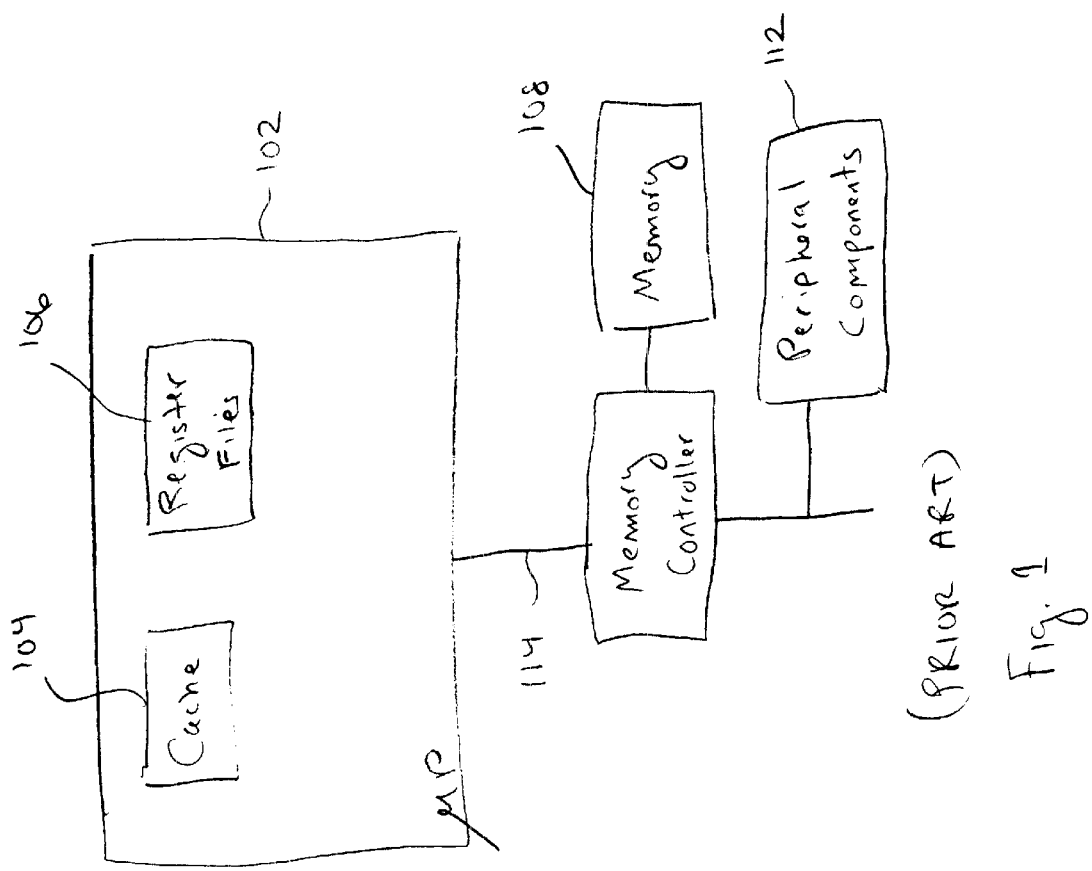
FIG. 1 is a portion of a computer system at a high abstraction level.
Figure 2:
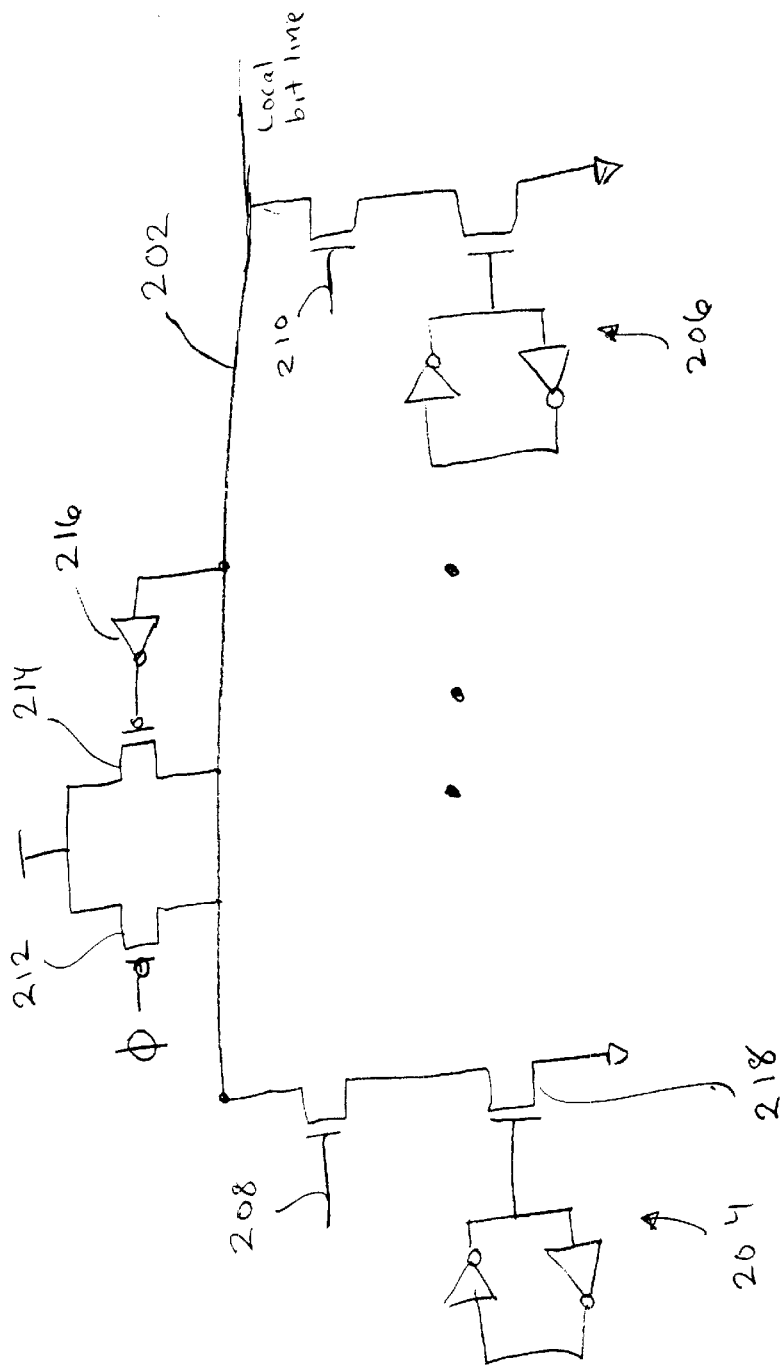
FIG. 2 is a prior art portion of a memory circuit showing memory cells and a shared local bit line.
Figure 3:
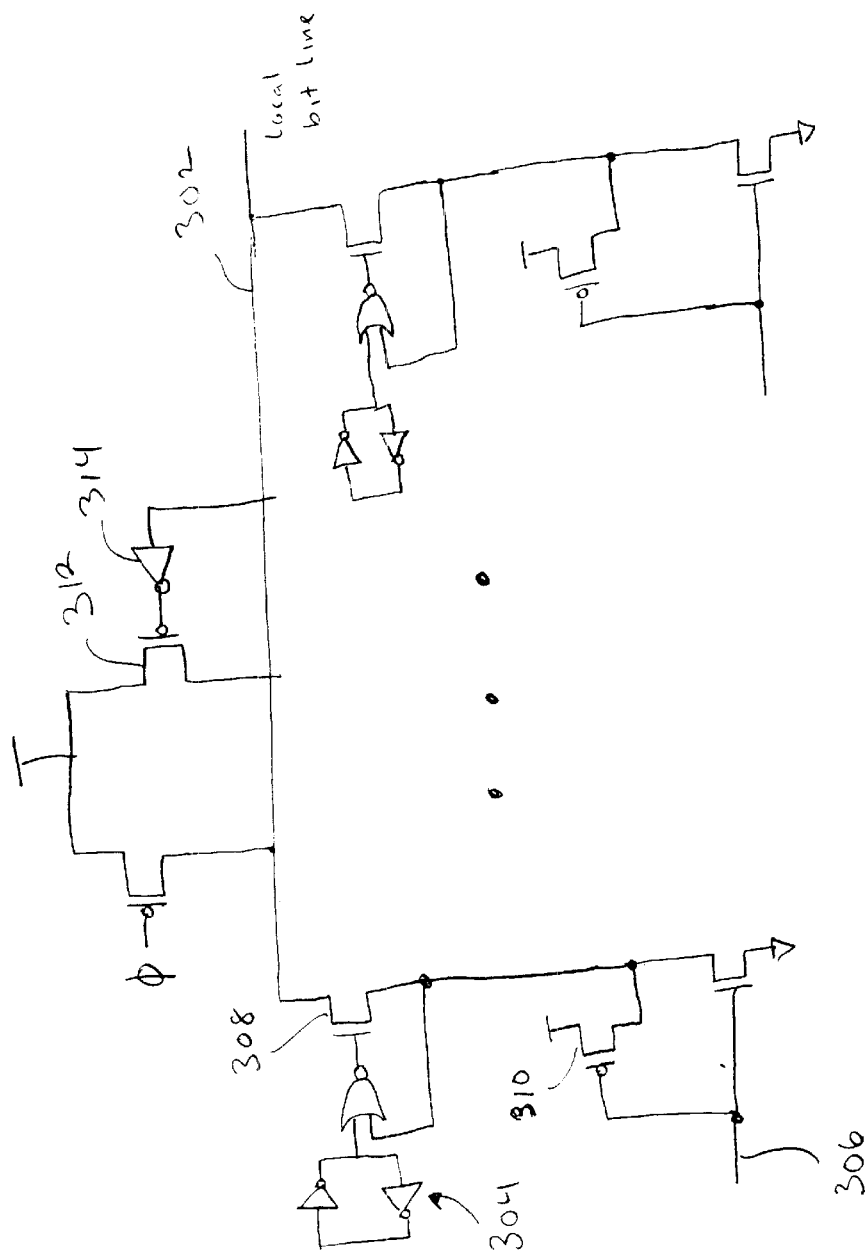
FIG. 3 is a prior art portion of a memory circuit showing memory cells and a shared local bit line and associated devices to reduce the effects of sub-threshold leakage current.
Figure 4:
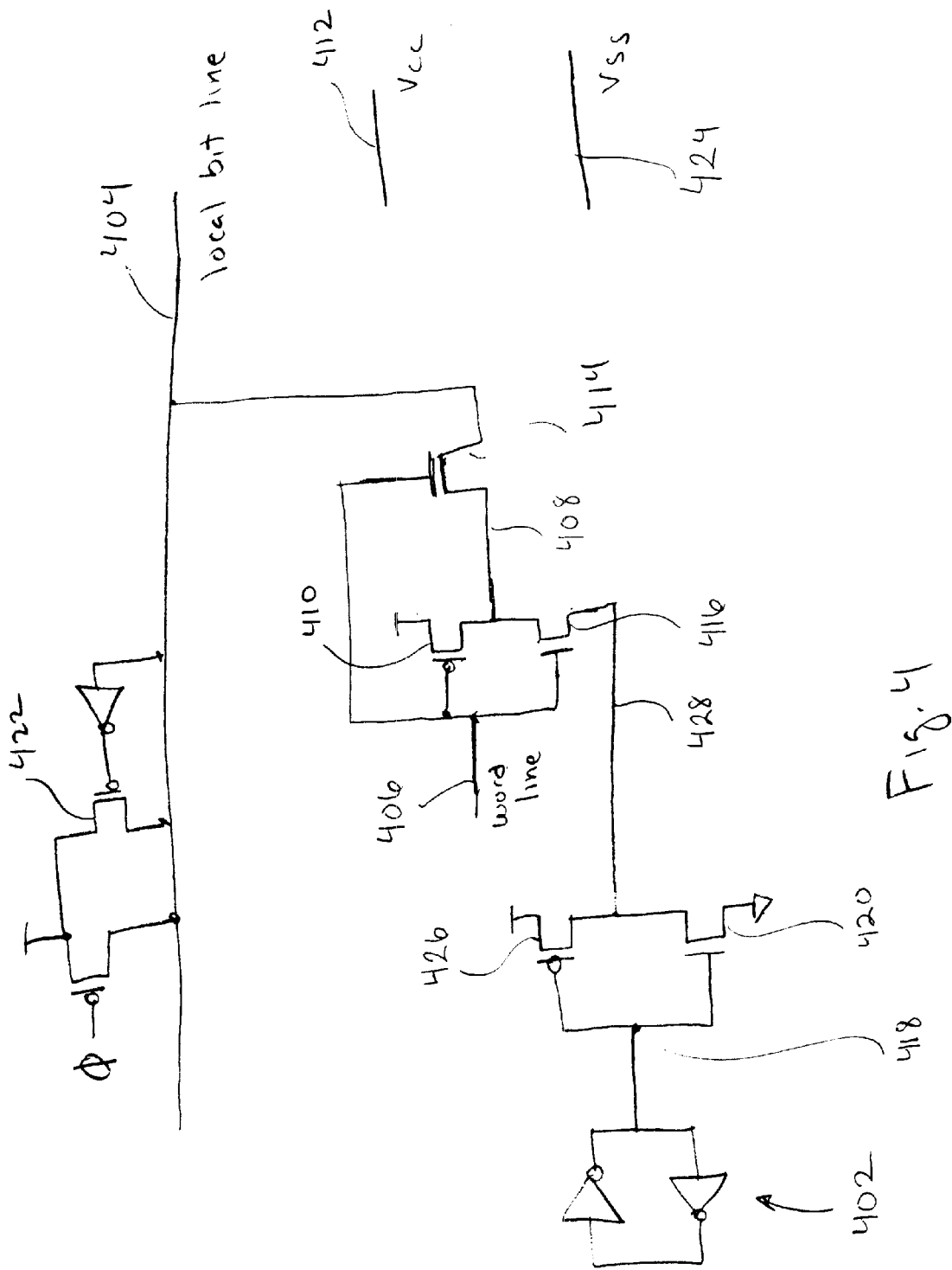
FIG. 4 is an embodiment of the present invention at the circuit level.

FIG. 4 shows at the circuit level memory cell 402 coupled to local bit line 404. For simplicity, only one memory cell is shown, but in practice there may be several or many such memory cells sharing a local bit line. Furthermore, for simplicity, no write ports are shown, and only one read port (one local bit line) is shown. In practice, there may be more than read port and more than one write port.

As indicated in the Background, when the stored information bit of a memory cell being read is such that it causes its corresponding access transistor to discharge its local bit line, sub-threshold current is not an issue because a read operation will read the stored information bit correctly. Thus, in describing the operation of the embodiment shown in FIG. 4 as it relates to sub-threshold current, it is only necessary to consider the case when local bit line 404 is HIGH.

Suppose word line 406 is LOW during an evaluation. The gate of access nMOSFET 414 is at $V_{SS}$ and pullup pMOSFET 410 charges source/drain terminal 408 to HIGH by providing a low impedance to power rail 412. Because local bit line 404 is HIGH and the gate of access nMOSFET 414 is at $V_{SS}$, the gate-to-source voltage of access nMOSFET 414 is such that $V_{GS}=-V_{CC}$ and its source-to-drain voltage is such that $V_{DS}=0$. Sub-threshold leakage current conducted by access nMOSFET 414 is essentially eliminated, and the half-keeper comprising 422 does not need to contend with sub-threshold leakage current.

Now consider the case in which word line 406 transitions from LOW to HIGH during a read operation (evaluation). Pullup pMOSFET 410 switches OFF, and the gate voltages of access nMOSFET 414 and nMOSFET 416 are at $V_{CC}$. If the stored information bit in memory cell 402 is such that node 418 is HIGH, then nMOSFETs 420, 416, and 414 will switch ON to discharge local bit line 404 by providing a low impedance path to ground 424, and the stored information bit in memory cell 402 is correctly read. Now suppose that the information bit stored in memory cell 402 is such that node 418 is LOW. Then nMOSFET 420 is OFF, but pMOSFET 426 is ON to charge source/drain terminal 428 to $V_{CC}$ by providing a low impedance path to power rail 412. Because local bit line 404 and source/terminal 408 have already been charged HIGH, the source-to-drain voltages on nMOSFET 416 and access nMOSFET 414 are both zero, and sub-threshold leakage current is again essentially eliminated.

Note that when word line 406 is LOW and node 418 is HIGH, sub-threshold leakage current may be conducted by nMOSFETs 416 and 420. In this case, any sub-threshold leakage current is provided by pullup pMOSFET 410. Furthermore, note that when word line 406 transitions from LOW to HIGH for a read operation, and if node 418 is LOW, then sub-threshold leakage current may be conducted through nMOSFET 420. However, in this case, any sub-threshold leakage current through nMOSFET 420 is provided by pMOSFET 426. Consequently, although sub-threshold leakage current is not eliminated in the circuit of FIG. 4, its effect upon local bit line 404 is mitigated because the half-keeper need not contend with sub-threshold leakage current. As a result, there is more design freedom to reduce the size of the half-keeper, and to employ low-$V_T$ transistors, leading to circuits with improved performance, compared to the case in which there is contention with sub-threshold leakage current.

Figure 5:
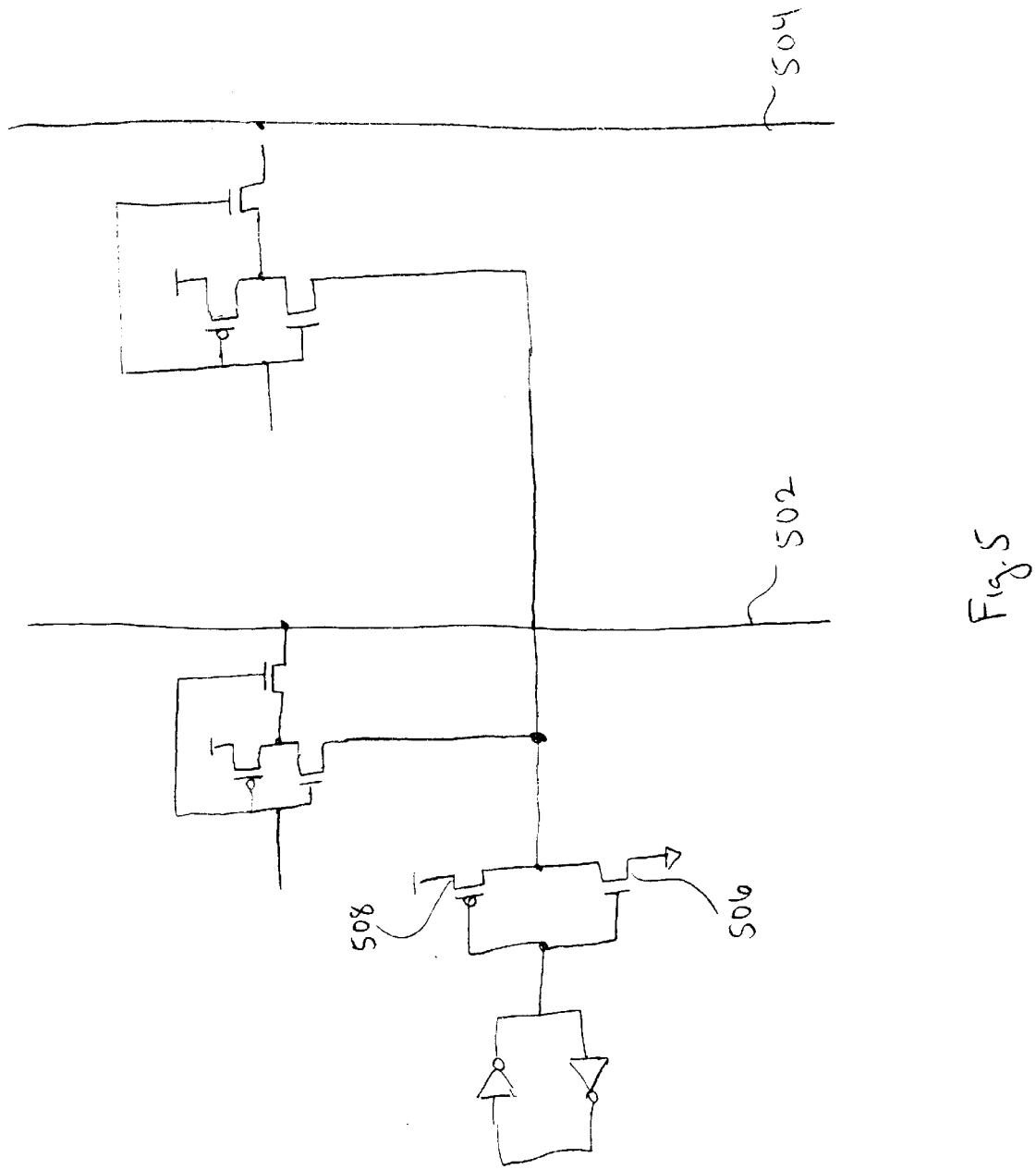
FIG. 5 is another embodiment of the present invention, showing more than one read port.

The combination of transistors 426 and 420 serves as a buffer (inverter), so that memory cell 402 is buffered from source/drain terminal 428, and in turn, buffered from local bit line 404. In this way, the information bit stored in memory cell 402 is buffered from other memory cells sharing local bit line 404. Furthermore, transistors 426 and 420 may be shared across multiple read ports to save area. For example, in FIG. 5, two read ports, local bit line 502 and local bit line 504, are shown connected to transistors 506 and 508. For simplicity, the half-keepers for local bit lines 502 and 504 are not shown.

Various modifications may be made to the disclosed embodiments without departing from the scope of the invention as claimed below.

What is claimed is:

1. A memory comprising:

a local bit line having a voltage V when charged;

a memory cell;

a word line port;

an access transistor to discharge the local bit line only if the word line port is in a first state and the memory cell stores a first information bit, the access transistor comprising a first source/drain terminal at the same voltage as the local bit line and comprising a second source/drain terminal;

a first pullup transistor to pull the second source/drain terminal of the access transistor to the voltage V only if the word line port is in a second state complementary to the first state; and a transistor to maintain the second source/drain terminal of the access transistor at the voltage V only if the word line port is in the first state and the memory cell stores a second information bit complementary to the first information bit.

2. The memory as set forth in claim 1, the transistor comprising a source/drain terminal, the memory further comprising:

a second pullup transistor to pull the source/drain terminal of the transistor to the voltage V only if the memory cell stores the second information bit.

3. The memory as set forth in claim 2, further comprising:

a pulldown transistor to pull the source/drain terminal to the transistor to ground potential only if the memory cell stores the first information bit.

4. The memory as set forth in claim 2, wherein the access transistor is a nMOSFET, and the first and second pullup transistors are pMOSFETs.

5. A memory comprising:

a local bit line;

a memory cell;

a word line port;

an access transistor to discharge the local bit line only if the word line port is in a first state and the memory cell stores a first information bit, the access transistor having a source-to-drain voltage;

a first pullup transistor coupled to the access transistor to maintain the source-to-drain voltage of the access transistor substantially at zero only if the word line port is in a second state complementary to the first state; and a transistor coupled to the access transistor to maintain the source-to-drain voltage of the access transistor substantially at zero only if the word line port is in the first state and the memory cell stores a second information bit complementary to the first information bit.

6. The memory as set forth in claim 5, the transistor having a source-to-drain voltage, the memory further comprising:

a second pullup transistor coupled to the transistor to maintain the source-to-drain voltage of the transistor to substantially zero only if the memory cell stores the second information bit.

7. The memory as set forth in claim 6, wherein the access transistor is a nMOSFET, and the first and second pullup transistors are pMOSFETs.

8. A memory comprising:
a power rail;
a ground;
a local bit line;
a memory cell;
a word line port;
an access transistor to conduct current from the local bit line to the ground only if the word line port is in a first state and the memory cell stores a first information bit, the access transistor comprising a source/drain terminal;
a first pullup transistor to provide a low impedance path from the source/drain terminal of the access transistor to the power rail only if the word line port is in a second state complementary to the first state; and
a transistor to conduct current from the access transistor to the ground only if the word line port is in the first state and the memory cell stores the first information bit.

9. The memory as set forth in claim 8, the transistor comprising a source/drain terminal, the memory further comprising:
a second pullup transistor to provide a low impedance path from the source/drain terminal of the transistor to the power rail only if the memory cell stores a second information bit complementary to the firs information bit.

10. The memory as set forth in claim 9, further comprising:
a pulldown transistor to conduct current from the transistor to the ground only if the memory cell stores the first information bit.

11. The memory as set forth in claim 9, wherein the access transistor is a nMOSFET, and the first and second pullup transistors are pMOSFETs.

12. A memory comprising:
a local bit line;
a memory cell;
a word line port;
an access nMOSFET comprising a first source/drain terminal connected to the local bit line, a gate connected to the word line port, and a second source/drain terminal; and
a first pMOSFET comprising a gate connected to the word line port, and a drain connected to the second source/drain terminal of the access transistor.

13. The memory as set forth in claim 12, further comprising:
a first nMOSFET comprising a gate connected to the word line port, a first source/drain terminal connected to the second source/drain terminal of the access transistor, and a second source/drain terminal.

14. The memory as set forth in claim 13, further comprising:
a second pMOSFET comprising a drain connected to the second source/drain of the first nMOSFET, and a gate connected to the memory cell.

15. The memory as set forth in claim 14, further comprising:
a second nMOSFET comprising a drain connected to the second sour/drain of the first nMOSFET, and a gate connected to the memory cell.

16. A computer system comprising:
a microprocessor;
system memory; and
a memory controller coupling the microprocessor to the system memory;
wherein the microprocessor further comprises memory, the memory comprising
a local bit line;
a memory cell;
a word line port;
an access nMOSFET comprising a first source/drain terminal connected to the local bit line, a gate connected to the word line port, and a second source/drain terminal; and
a first pMOSFET comprising a gate connected to the word line port, and a drain connected to the second source/drain terminal of the access transistor.

17. The computer system as set forth in claim 16, further comprising:
a first nMOSFET comprising a gate connected to the word line port, a first source/drain terminal connected to the second source/drain terminal of the access transistor, and a second source/drain terminal.

18. The computer system as set forth in claim 17, further comprising:
a second pMOSFET comprising a drain connected to the second source/drain of the first nMOSFET, and a gate connected to the memory cell; and
a second nMOSFET comprising a drain connected to the second source/drain of the first nMOSFET, and a gate connected to the memory cell.

* * * * *